(12) United States Patent
Liu et al.

(10) Patent No.: US 12,321,316 B2
(45) Date of Patent: Jun. 3, 2025

(54) DETERMINATION OF REVISION HISTORY FOR DATA FILES

(71) Applicant: Procore Technologies, Inc., Carpinteria, CA (US)

(72) Inventors: Jiazi Liu, Ontario (CA); Mohammad Mostafa Soltani, Ontario (CA); Patavee Meemeng, Los Angeles, CA (US)

(73) Assignee: Procore Technologies, Inc., Carpinteria, CA (US)

( * ) Notice: Subject to any disclaimer, the term of this patent is extended or adjusted under 35 U.S.C. 154(b) by 0 days.

(21) Appl. No.: 18/181,410

(22) Filed: Mar. 9, 2023

(65) Prior Publication Data

US 2024/0303223 A1    Sep. 12, 2024

(51) Int. Cl.
*G06F 16/00* (2019.01)
*G06F 16/13* (2019.01)
*G06F 16/16* (2019.01)
*G06F 16/17* (2019.01)

(52) U.S. Cl.
CPC .......... *G06F 16/1734* (2019.01); *G06F 16/13* (2019.01); *G06F 16/168* (2019.01)

(58) Field of Classification Search
None
See application file for complete search history.

(56) References Cited

U.S. PATENT DOCUMENTS 9,817,805 B1 * 11/2017 Markman ............. G06Q 10/103
10,324,903 B1 * 6/2019 Goldberg ............. G06F 16/162
2005/0125384 A1 * 6/2005 Gilfix ..................... G06F 16/10
2006/0136810 A1 * 6/2006 Truong ................. G06F 40/174
715/222
2014/0331062 A1 * 11/2014 Tewari ................ G06F 21/6227
713/189

(Continued)

OTHER PUBLICATIONS

Abioye, Sofiat O. et al., "Artificial Intelligence in the Construction Industry: A Review of Present Status, Opportunities and Future Challenges", Journal of Building Engineering, vol. 44, Oct. 5, 2021, 13 pages.

(Continued)

*Primary Examiner* — Hasanul Mobin
(74) *Attorney, Agent, or Firm* — Lee Sullivan Shea & Smith LLP

(57) ABSTRACT

A computing platform is configured to: (i) obtain a plurality of data files; (ii) for each respective data file of the plurality of obtained data files, obtain contents associated with the respective data file and evaluate the contents associated with the respective data file to determine a respective data structure for the respective data file; (iii) compare the determined respective data structures and thereby identify one or more data structure differences among the determined respective data structures for the data files; (iv) based on the identified one or more data structure differences among the determined respective data structures for the data files, determine a revision history for the plurality of data files; and (v) transmit, to a client station, a communication related to the revision history and thereby cause an indication of the revision history to be presented at a user interface of the client station.

20 Claims, 10 Drawing Sheets

(56) References Cited

U.S. PATENT DOCUMENTS

| | | | | |
|---|---|---|---|---|
| 2016/0034273 | A1* | 2/2016 | Leupold | G06F 8/71 |
| | | | | 717/122 |
| 2016/0147783 | A1* | 5/2016 | Cho | G06T 1/60 |
| | | | | 707/827 |
| 2016/0217413 | A1* | 7/2016 | Coombes | H04L 63/102 |
| 2018/0096000 | A1* | 4/2018 | Harrison | G06F 16/24578 |
| 2018/0314680 | A1* | 11/2018 | Dorai | G06F 40/166 |
| 2019/0278669 | A1* | 9/2019 | Mueller-Wicke | G06F 16/176 |
| 2019/0324727 | A1* | 10/2019 | Carranza | G06F 8/437 |
| 2020/0177485 | A1* | 6/2020 | Shurtleff | H04L 67/535 |
| 2020/0184724 | A1* | 6/2020 | Schell | G06F 18/22 |
| 2020/0232884 | A1* | 7/2020 | Onekea | G06F 18/22 |
| 2021/0141712 | A1* | 5/2021 | Gevorkyan | G06F 11/3692 |
| 2021/0157954 | A1* | 5/2021 | Majko-Ruben | G06F 16/1873 |
| 2021/0382865 | A1* | 12/2021 | Matovinovic | G06Q 30/0185 |
| 2024/0184796 | A1* | 6/2024 | Rajan | G06F 3/01 |
| 2024/0303223 | A1* | 9/2024 | Liu | G06F 40/197 |

OTHER PUBLICATIONS

AI for Architectural Review, mbue [online], [retrieved Feb. 22, 2023], Retrieved from the Internet:<URL:www.mbue.ai, 6 pages.
Our Story, mbue [online], [retrieved Feb. 22, 2023], Retrieved from the Internet:<URL:www.mbue.ai/our-story, 2 pages.
Free Beta, mbue [online], [retrieved Feb. 22, 2023], Retrieved from the Internet:<URL:www.mbue.ai/free-beta, 5 pages.

* cited by examiner

Revision History for Data Files — 602

Total Number of Data Files Analyzed:     3

| Different Copies of Same Data File? | YES |
|---|---|
| Data File Set(s) | Version |
| SET 1 | |
| - Data File for Technical Drawing 500 | 1 — 604a |
| - Data File for Technical Drawing 504 | 2 — 604b |
| - Data File for Technical Drawing 502 | 3 (current) — 604c |

FIG. 6

DETERMINATION OF REVISION HISTORY FOR DATA FILES

BACKGROUND

Construction projects are often complex endeavors involving the coordination of many professionals across several discrete phases. Typically, a construction project commences with a design phase, where architects design the overall shape and layout of a construction project, such as a building. Next, engineers engage in a planning phase where they take the architects' designs and produce engineering drawings and plans for the construction of the project. At this time, engineers may also design various portions of the project's infrastructure, such as HVAC, plumbing, electrical, etc., and produce plans reflecting these designs as well. After, or perhaps in conjunction with, the planning phase, contractors may engage in a logistics phase to review these plans and begin to allocate various resources to the project, including determining what materials to purchase, scheduling delivery, and developing a plan for carrying out the actual construction of the project. Finally, during the construction phase, construction professionals begin to construct the project based on the finalized plans.

OVERVIEW

Construction projects may be complex endeavors during which numerous individuals and/or parties work to facilitate completion of the construction project. Further, when approaching, planning, and carrying out a construction project, it is often necessary for individuals and/or parties to create, review, revise, and/or exchange data files associated with the construction project, examples of which may include DOC files, XLS files, PPT files, PDF files, JPEG files, Building Information Model (BIM) files, and Computer-Aided Design (CAD) files (e.g., DWG files, NWF files, etc.), among other possibilities. Oftentimes, throughout a construction project and with respect to a given data file for a construction-related matter, the given data file is exchanged and/or undergoes updates or changes implemented by one or more parties. In turn, there may be multiple copies of the given data file generated, reviewed, revised and/or exchanged. Further, because construction projects may be complex endeavors involving multiple different phases, large numbers of data files (which may be on the order of thousands, tens of thousands, hundreds of thousands, etc.), and coordination of multiple different teams of individuals, organizations may face various challenges when attempting to control and manage data files associated with construction projects (and, more particularly, when attempting to control and manage multiple different copies of a given data file for a construction-related matter).

One example challenge faced when controlling and managing multiple different copies of a given data file is ensuring that an up-to-date copy of the data file is being accessed, reviewed, revised, and/or exchanged. If an out-of-date copy of a data file is being accessed, reviewed, revised, and/or exchanged, there is a risk that unreliable, inaccurate, and/or out-of-date data files could be disseminated among teams and individuals involved in the construction project, which may lead to a host of problems on the construction project-including scheduling delays and other costly mistakes.

In an effort to alleviate some of these problems, a given individual (or perhaps multiple individuals) that is presented with multiple copies of a given data file but is not aware which copy is the most up-to-date version may manually review the multiple copies of the data file and compare them to one another, so as to determine a revision history for the copies and identify which data file among the multiple copies is the most up-to-date. After determining which copy the individual believes is the most up-to-date copy, the given individual may then use that copy to review, revise, and/or exchange the data file.

However, as the number of data files associated with a construction project increases, requiring a user to carry out these tasks of manually reviewing the multiple copies of the data file and comparing them to one another, so as to determine a revision history for the copies and identify the most up-to-date copy (which may referred to herein as a "user-driven approach"), becomes a cumbersome, labor intensive, and time-consuming process. Additionally, this user-driven approach for determining the most up-to-date copy may be prone to user error, such as a user identifying the incorrect copy as the most up-to-date copy, which may lead to a misunderstanding and/or error when reviewing, revising, and/or exchanging the data file among teams and individuals. The user-driven approach for determining the most up-to-date copy may give rise to other problems as well.

Further, existing software may allow a user to compare a first document to a second document in order to view the changes/revisions made between the first document and the second document (which may be referred to as a "software-based, document-comparison approach"). However, this software-based, document-comparison approach is unable to analyze the documents in order to determine which copy is the most up-to-date copy, much less determine a revision history for three or more documents and identify a revision history for the three or more documents and identify the most up-to-date copy. The software-based, document-comparison approach may give rise to other problems as well.

To help address the aforementioned and other problems, disclosed herein is new software technology for determining a revision history for a plurality of data files and identifying a most up-to-date copy. In practice, the disclosed software technology could be implemented in a software as a service ("SaaS") application for construction management, such as the SaaS application offered by Procore Technologies, Inc., but it should be understood that the disclosed technology for determining a revision history for a plurality of data files and identifying a most up-to-date copy may be incorporated into various other types of software applications as well (including software applications for determining a revision history for a plurality of data files and identifying a most up-to-date copy in industries other than construction).

In accordance with the disclosed technology, a computing platform is configured to obtain a plurality of data files and, for each respective data file of the plurality of obtained data files, obtain contents associated with the respective data file and evaluate the contents associated with the respective data file to determine a respective data structure for the respective data file. The computing platform is further configured to compare the determined respective data structures and thereby identify one or more data structure differences among the determined respective data structures for the data files. The computing platform is further configured to, based on the identified one or more data structure differences among the determined respective data structures for the data files, determine a revision history for the plurality of data files. The computing platform is further configured to transmit, to a client station, a communication related to the revision history for the plurality of data files and thereby cause an indication of the revision history to be presented at a user interface of the client station.

The software technology disclosed herein may provide various benefits over existing techniques for determining a revision history for a plurality of data files and identifying a most up-to-date copy. For instance, as noted above, existing approaches for determining a revision history for a plurality of data files and identifying a most up-to-date copy may require users to expend a substantial amount of time and effort to determine the revision history for the plurality of data files and identify a most up-to-date copy. Advantageously, the disclosed approach for determining a revision history for a plurality of data files and identifying a most up-to-date copy may help to significantly reduce this time and effort by automatically evaluating the data files, automatically determining data structures for the data files, and automatically determining, based on identified data structure differences among the determined data structures for the data files, a revision history for the plurality of data files. Further, as mentioned above, existing approaches for determining a revision history for a plurality of data files and identifying a most up-to-date copy may be prone to user error, such as a user identifying the incorrect copy as the most up-to-date copy. The disclosed technology may reduce or limit errors that may otherwise occur in existing approaches due to such user error.

In accordance with the above, in one aspect, disclosed herein is a method that involves a computing platform: (i) obtaining a plurality of data files; (ii) for each respective data file of the plurality of obtained data files, obtaining contents associated with the respective data file and evaluating the contents associated with the respective data file to determine a respective data structure for the respective data file; (iii) comparing the determined respective data structures and thereby identifying one or more data structure differences among the determined respective data structures for the data files; (iv) based on the identified one or more data structure differences among the determined respective data structures for the data files, determining a revision history for the plurality of data files; and (v) transmitting, to a client station, a communication related to the revision history for the plurality of data files and thereby causing an indication of the revision history to be presented at a user interface of the client station.

In another aspect, disclosed herein is a computing system that includes at least one processor, a non-transitory computer-readable medium, and program instructions stored on the non-transitory computer-readable medium that are executable by the at least one processor to cause the computing platform to carry out the functions disclosed herein, including but not limited to the functions of the foregoing method.

In yet another aspect, disclosed herein is a non-transitory computer-readable medium comprising program instructions that are executable to cause a computing platform to carry out the functions disclosed herein, including but not limited to the functions of the foregoing method.

One of ordinary skill in the art will appreciate these as well as numerous other aspects in reading the following disclosure.

BRIEF DESCRIPTION OF THE DRAWINGS

FIG. 6 depicts an example snapshot of a GUI that may be presented to a user according to the disclosed technology.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

As noted above, the present disclosure generally relates to technology for determining a revision history of a plurality of data files. In practice, the disclosed technology may be incorporated into a software as a service ("SaaS") application that facilitates construction management, which may include back-end software that runs on a back-end computing platform and front-end software that runs on users' client stations (e.g., in the form of a native application, a web application, and/or a hybrid application, etc.) and can be used to access the SaaS application via a data network, such as the Internet. For instance, as one possible example, the disclosed technology may be incorporated into a SaaS application for construction management, such as the one offered by Procore Technologies, Inc. However, other examples are possible as well.

I. Example System Configuration

Figure 1:
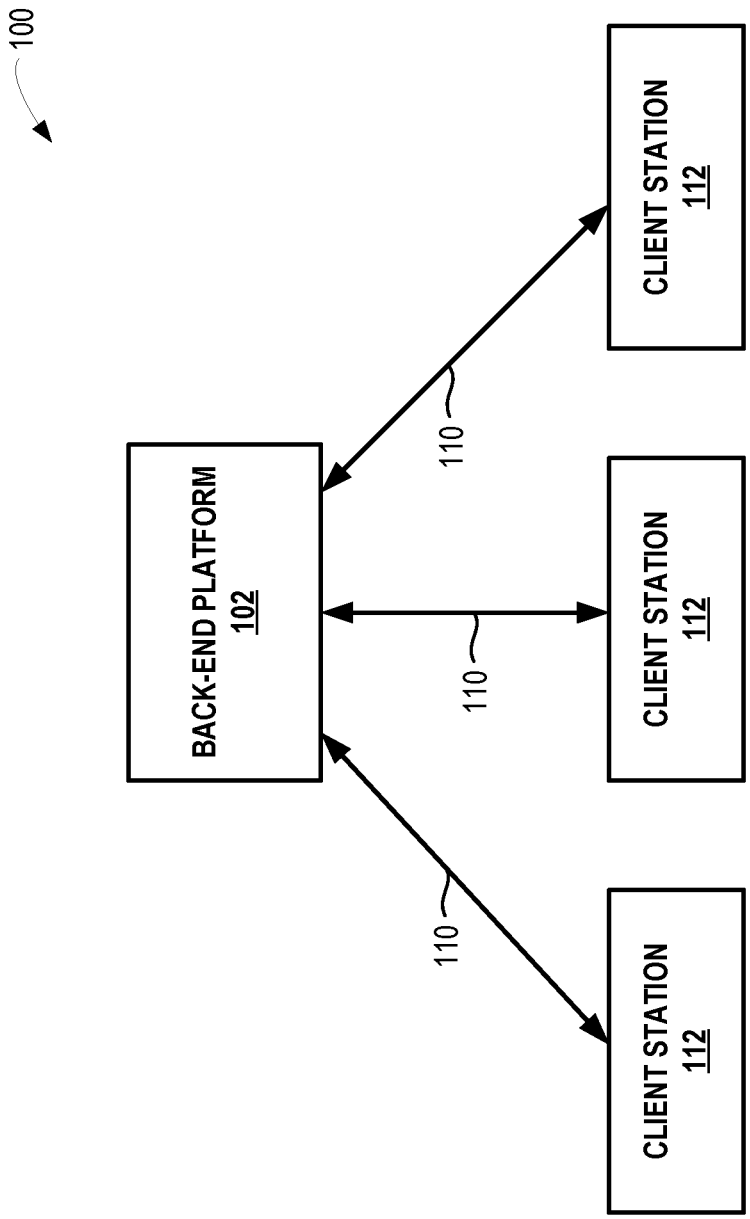
FIG. 1 depicts an example network configuration in which example embodiments may be implemented.

Turning now to the figures, FIG. 1 depicts an example network configuration 100 in which example embodiments of the present disclosure may be implemented. As shown in FIG. 1, network configuration 100 includes a back-end computing platform 102 that may be communicatively coupled to one or more client stations, depicted here, for the sake of discussion, as client stations 112.

Broadly speaking, back-end computing platform 102 may comprise one or more computing systems that have been installed with back-end software (e.g., program code) for hosting an example SaaS application that incorporates the disclosed technology and delivering it to users over a data network. The one or more computing systems of back-end computing platform 102 may take various forms and be arranged in various manners.

For instance, as one possibility, back-end computing platform 102 may comprise cloud computing resources that are supplied by a third-party provider of "on demand" cloud computing resources, such as Amazon Web Services (AWS), Amazon Lambda, Google Cloud Platform (GCP), Microsoft Azure, or the like, which may be provisioned with software for carrying out one or more of the functions disclosed herein. As another possibility, back-end computing platform 102 may comprise "on-premises" computing resources of the organization that operates the example computing platform 102 (e.g., organization-owned servers), which may be provisioned with software for carrying out one or more of the functions disclosed herein. As yet another possibility, the example computing platform 102 may comprise a combination of cloud computing resources and on-premises computing resources. Other implementations of back-end computing platform 102 are possible as well.

In turn, client stations 112 may each be any computing device that is capable of accessing the SaaS application hosted by back-end computing platform 102. In this respect, client stations 112 may each include hardware components such as a processor, data storage, a communication interface, and user-interface components (or interfaces for connecting thereto), among other possible hardware components, as well as software components that facilitate the client station's ability to access the SaaS application hosted by back-end computing platform 102 and run the front-end software of the SaaS application (e.g., operating system software, web browser software, mobile applications, etc.). As representative examples, client stations 112 may each take the form of a desktop computer, a laptop, a netbook, a tablet, a smartphone, and/or a personal digital assistant (PDA), among other possibilities.

As further depicted in FIG. 1, back-end computing platform 102 may be configured to interact with client stations 112 over respective communication paths 110. In this respect, each communication path 110 between back-end computing platform 102 and one of client stations 112 may generally comprise one or more communication networks and/or communications links, which may take any of various forms. For instance, each respective communication path 110 with back-end computing platform 102 may include any one or more of point-to-point links, Personal Area Networks (PANs), Local-Area Networks (LANs), Wide-Area Networks (WANs) such as the Internet or cellular networks, and/or cloud networks, among other possibilities. Further, the communication networks and/or links that make up each respective communication path 110 with back-end computing platform 102 may be wireless, wired, or some combination thereof, and may carry data according to any of various different communication protocols. Although not shown, the respective communication paths 110 between client stations 112 and back-end computing platform 102 may also include one or more intermediate systems. For example, it is possible that back-end computing platform 102 may communicate with a given client station 112 via one or more intermediary systems, such as a host server (not shown). Many other configurations are also possible.

While FIG. 1 shows an arrangement in which three client stations are communicatively coupled to back-end computing platform 102, it should be understood that this is merely for purposes of illustration and that any number of client stations may communicate with back-end computing platform 102.

Although not shown in FIG. 1, back-end computing platform 102 may also be configured to interact with other third-party computing platforms, such as third-party computing platforms operated by organizations that have subscribed to the SaaS application and/or third-party computing platforms operated by organizations that provide back-end computing platform 102 with third-party data for use in the SaaS application. Such computing platforms, and the interaction between back-end computing platform 102 and such computing platforms, may take various forms.

It should be understood that network configuration 100 is one example of a network configuration in which embodiments described herein may be implemented. Numerous other arrangements are possible and contemplated herein. For instance, other network configurations may include additional components not pictured and/or more or fewer of the pictured components.

II. Example Computing Platform

Figure 2:
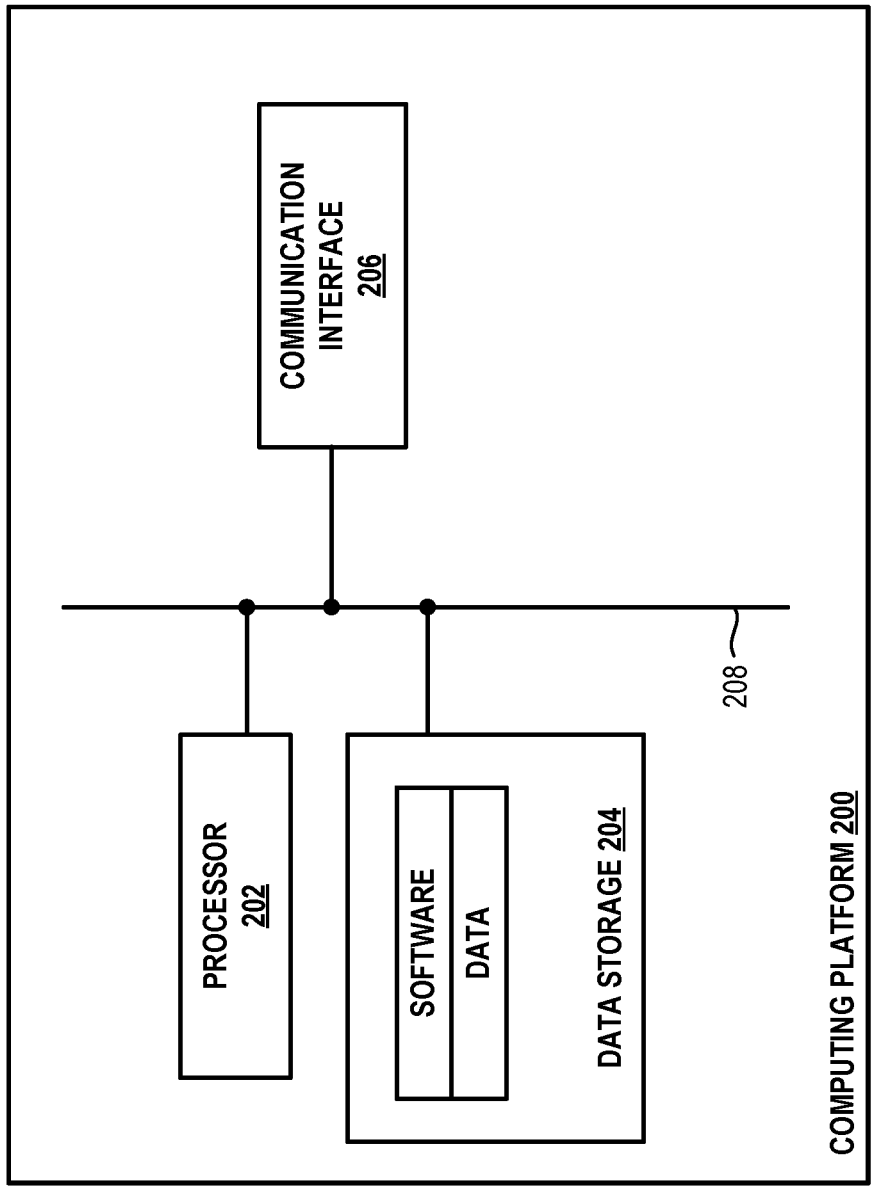
FIG. 2 depicts an example computing platform that may be configured to carry out one or more of the functions according to the disclosed technology.

FIG. 2 is a simplified block diagram illustrating some structural components that may be included in an example computing platform 200, which could serve as, for instance, back-end computing platform 102 of FIG. 1. In line with the discussion above, computing platform 200 may generally comprise one or more computer systems (e.g., one or more servers), and these one or more computer systems may collectively include at least a processor 202, data storage 204, and a communication interface 206, all of which may be communicatively linked by a communication link 208 that may take the form of a system bus, a communication network such as a public, private, or hybrid cloud, or some other connection mechanism.

Processor 202 may comprise one or more processing components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that processor 202 could comprise processing components that are distributed across a plurality of physical computing devices connected via a network, such as a computing cluster of a public, private, or hybrid cloud.

In turn, data storage 204 may comprise one or more non-transitory computer-readable storage mediums that are collectively configured to store (i) program instructions that are executable by processor 202 such that computing platform 200 is configured to perform some or all of the disclosed functions, which may be arranged together into engineering artifacts or the like, and (ii) data that may be received, derived, or otherwise stored by computing platform 200 in connection with the disclosed functions. In this respect, the one or more non-transitory computer-readable storage mediums of data storage 204 may take various forms, examples of which may include volatile storage mediums such as random-access memory, registers, cache, etc. and non-volatile storage mediums such as read-only memory, hard-disk drives, solid-state drives, flash memory, optical-storage devices, etc. Further, data storage 204 may utilize any of various types of data storage technologies to store data within the computing platform 200, examples of which may include relational databases, NoSQL databases (e.g., columnar databases, document databases, key-value databases, graph databases, etc.), file-based data stores (e.g., Hadoop Distributed File System or Amazon Elastic File System), object-based data stores (e.g., Amazon S3), data warehouses (which could be based on one or more of the foregoing types of data stores), data lakes (which could be based on one or more of the foregoing types of data stores), message queues, and/or streaming event queues, among other possibilities. Further yet, in line with the discussion above, it should also be understood that data storage 204 may comprise computer-readable storage mediums that are distributed across a plurality of physical computing devices connected via a network, such as a storage cluster of a public, private, or hybrid cloud. Data storage 204 may take other forms and/or store data in other manners as well.

Communication interface 206 may be configured to facilitate wireless and/or wired communication with client stations (e.g., one or more client stations 112 of FIG. 1) and/or third-party computing platform. Additionally, in an implementation where computing platform 200 comprises a plurality of physical computing systems connected via a network, communication interface 206 may be configured to facilitate wireless and/or wired communication between these physical computing systems (e.g., between computing and storage clusters in a cloud network). As such, communication interface 206 may take any suitable form for carrying out these functions, examples of which may include an Ethernet interface, a serial bus interface (e.g., Firewire, USB 2.0, etc.), a chipset and antenna adapted to facilitate any of various types of wireless communication (e.g., WiFi communication, cellular communication, etc.), and/or any other interface that provides for wireless and/or wired communication. Communication interface 206 may also include multiple communication interfaces of different types. Other configurations are possible as well.

Although not shown, computing platform 200 may additionally include or have an interface for connecting to user-interface components that facilitate user interaction with computing system 200, such as a keyboard, a mouse, a trackpad, a display screen, a touch-sensitive interface, a stylus, a virtual-reality headset, and/or speakers, among other possibilities.

It should be understood that computing platform 200 is one example of a computing system that may be used with the embodiments described herein. Numerous other arrangements are possible and contemplated herein. For instance, other computing systems may include additional components not pictured and/or more or fewer of the pictured components.

III. Example Operations

As mentioned above, the present disclosure generally relates to technology for determining a revision history for a plurality of data files. As further mentioned above, the determination of a revision history for a plurality of data files described herein can be carried out by a back-end computing platform, such as back-end computing platform 102 of FIG. 1, that is hosting a SaaS application comprising front-end software running on users' client stations and back-end software running on the back-end computing platform that is accessible to the client stations via a data network, such as the Internet. For instance, the disclosed technology is described below in the context of a SaaS application for construction management, such as the SaaS application offered by Procore Technologies, Inc., but it should be understood that the disclosed technology may be utilized to control and manage data files in various other contexts as well.

i. Determination of Revision History for Plurality of Data Files

As noted above, it may be desirable to determine a revision history for a plurality of data files for various reasons, such as for controlling and managing data files associated with construction projects, among other possibilities. The disclosed technology facilitates determination of a revision history for a plurality of data files for controlling and managing data files associated with construction projects.

Figure 3:
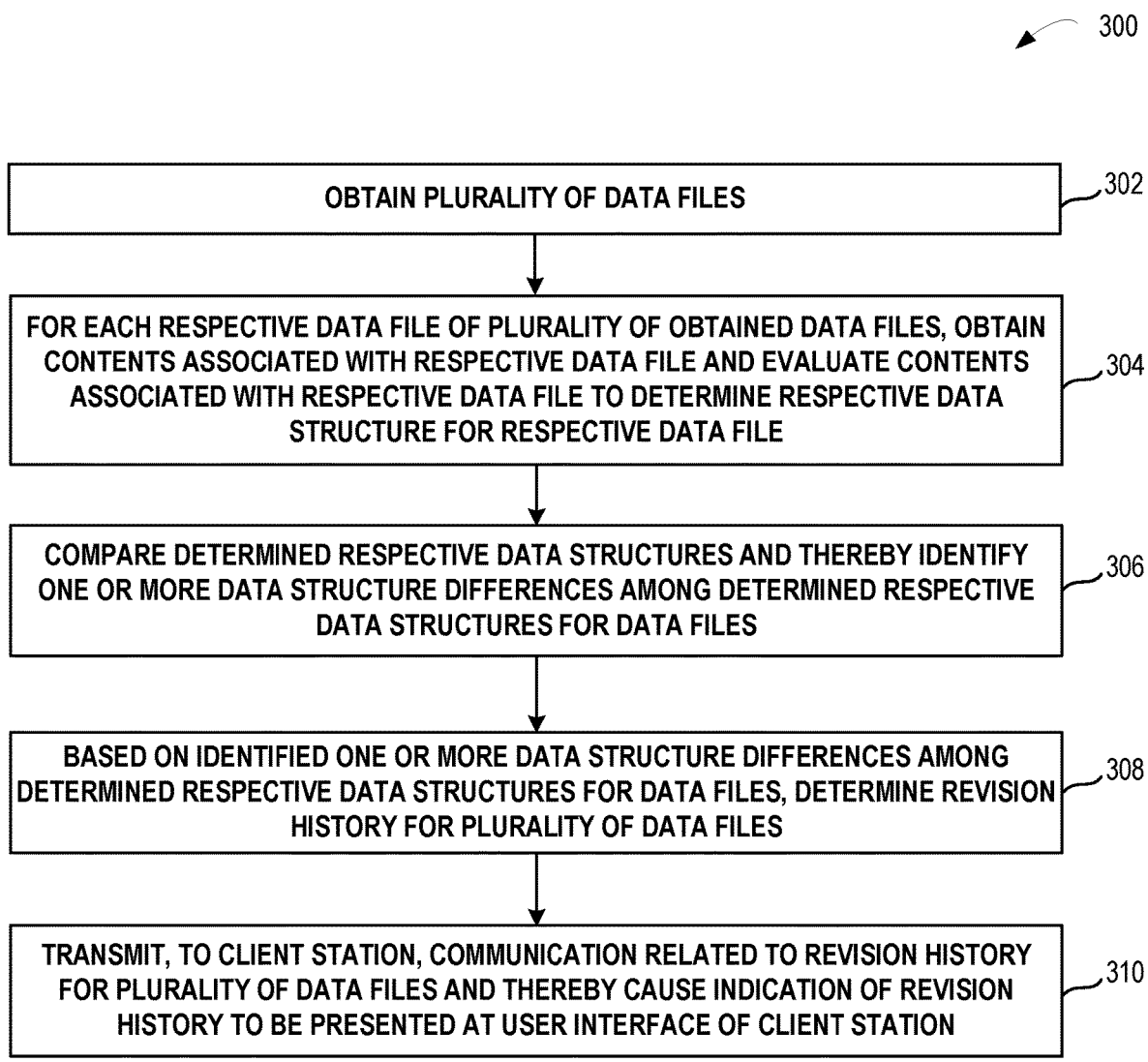
FIG. 3 depicts an example process for determining a revision history for the plurality of data files according to the disclosed technology.

FIG. 3 depicts one example of a process 300 that may be carried out in accordance with the disclosed technology in order to facilitate the determination of a revision history for a plurality of data files. For purposes of illustration only, example process 300 is described as being carried out by back-end computing platform 102 of FIG. 1, but it should be understood that example process 300 may be carried out by computing platforms that take other forms as well. Further, it should be understood that, in practice, the functions described with reference to FIG. 3 may be encoded in the form of program instructions that are executable by one or more processors of back-end computing platform 102. Further yet, it should be understood that the disclosed process is merely described in this manner for the sake of clarity and explanation and that the example embodiment may be implemented in various other manners, including the possibility that functions may be added, removed, rearranged into different orders, combined into fewer blocks, and/or separated into additional blocks depending upon the particular embodiment.

a. Obtain Data Files

The example process 300 may begin at block 302, where back-end computing platform 102 obtains a plurality of data files. Back-end computing platform 102 may be configured to obtain the plurality of data files in various ways. In an example, back-end computing platform 102 may receive the plurality of data files from one or more client stations. Back-end computing platform 102 may receive a data file or data files from a client station in any suitable way. As one example, a user may upload a data file about a construction project through a client station running front-end software for a SaaS application. For instance, with reference to FIG. 1, a user of one of client stations 112 may upload the data file (perhaps along with other data files as well), and back-end computing platform 102 may then receive the uploaded data file (perhaps along with the other uploaded data files) from client station 112 over a data network such as the Internet.

As another example, a SaaS application may be configured such that a user may upload one or more data files by sending an email. For instance, a user of one of client stations 112 may send an email addressed to a platform administrator's email address, and the user may attach the one or more data files that the user wishes to upload. Back-end computing platform 102 may be configured to access the email having the attachments, so as to receive the one or more data files.

In yet another example, a SaaS application may be configured such that a user of one of client stations 112 may save one or more data files to a shared data store to which both client station 112 and back-end computing platform 102 have access. In turn, back-end computing platform 102 may retrieve files from the shared data store, and as such, saving the one or more data files on the shared drive may result in the one or more data files being received by back-end computing platform 102. Other examples of obtaining the data files are possible as well.

Further, in general, the plurality of data files may be any suitable data files. For instance, any data files relevant to a construction project(s) may be received by back-end computing platform 102 running the SaaS application for construction management. The data files may be any suitable type of file including, for instance, documents, images, spreadsheets, drawings, models, and so forth. Further, any suitable format of the data files is possible as well, including, for instance, DOC files, XLS files, PPT files, PDF files, JPEG files, Building Information Model (BIM) files, and Computer-Aided Design (CAD) files (e.g., DWG files, NWF files, etc.), among other possibilities.

Still further, in general, the number of data files obtained by back-end computing platform 102 may be any suitable number of data files. For instance, the number of data files may be any number of data files for which a revision history for the data files is desired. In some examples, the plurality of obtained data files comprises three or more data files. For instance, the plurality of data files may be three data files, five data files, 10 data files, 15 data files, 20 data files, 25 data files, 50 data files, and so forth, among other possibilities.

b. Determination of Data Structures for the Obtained Data Files

At block 304, back-end computing platform 102, for each respective data file of the plurality of obtained data files, obtains contents associated with the respective data file and evaluates the contents associated with the respective data file to determine a respective data structure for the respective data file.

In general, the obtained contents may be any suitable contents for determining a respective data structure for the respective data file. The obtained contents may take various forms. As one possibility, the contents may include metadata associated with the respective data file, which may generally comprise data that provides information about the data file. In practice, a data file may have metadata for any of various associated metadata fields, examples of which may include metadata fields that respectively contain information such as file name, file type, file format, extension, and other various types of file properties (e.g., such as created date, creator, file size (in bytes), number of pages, and/or page size (width and height)). Other metadata is possible as well. As another possibility, the contents may include layout information. Any suitable layout information is possible, such as header, footer, table of contents, sections, subsections, tables, embedded images, diagram, figures (pie charts, curve graphs and bar charts), mathematical equations, and/or inserted comments. As yet another possibility, the contents may include text of the data file (e.g., text strings). As still yet another possibility, the contents may include text information associated with the text, such as printing or handwriting, font type, and/or font size. As still yet another possibility, the contents may include lines segments and other shapes within a technical drawing file, which represent the physical elements of the construction project that are to be constructed. As still yet another possibility, the contents may include location information associated with the data file. In an example, the location information may include the coordinates, within the data file, of where in the data file contents appear. Other example contents are possible as well.

Further yet, back-end computing platform 102 may obtain the contents associated with a data file in any suitable way, examples of which are described below. As one possibility, back-end computing platform 102 may extract content from the data file. For example, a native data file being uploaded may itself comprise one or more metadata fields that are associated with the native data file (e.g., metadata generated by the application that created the data file), in which case back-end computing platform 102 may extract the native metadata for certain of these metadata fields. As another possibility, back-end computing platform 102 may perform an analysis on the data file (e.g., analysis using natural language processing (NLP), image processing, and/or other machine learning-based techniques), and generate certain types of content associated with the data file based on the computing-platform analysis that is then stored for the data file. Some example approaches for identifying the contents of two-dimensional drawings files using image segmentation techniques are discussed in U.S. patent application Ser. No. 17/957,501, filed Sep. 30, 2022 and entitled "Computer Systems and Methods for Identifying Location Entities and Generating a Location Entity Data Taxonomy," which is incorporated by reference herein in its entirety. Other examples of obtaining content associated with the data file are possible as well.

After obtaining the contents associated with the data file in any of the manners described above, back-end computing platform 102 may evaluate the contents associated with the respective data file to determine a respective data structure for the respective data file. In general, the respective data structure for the respective data file may be any suitable data structure that may in turn facilitate determination of a revision history for the plurality of data files. Various types of data structures are possible. As one possibility, the data structure may be a tree structure. In general, a tree structure may include a plurality of nodes, where each node is populated with a respective portion of the obtained contents associated with the respective data file. Various nodes are possible including, for instance, file-type nodes, file-name nodes, file-property nodes, and/or file-layout nodes, among other possibilities.

Figure 4A:
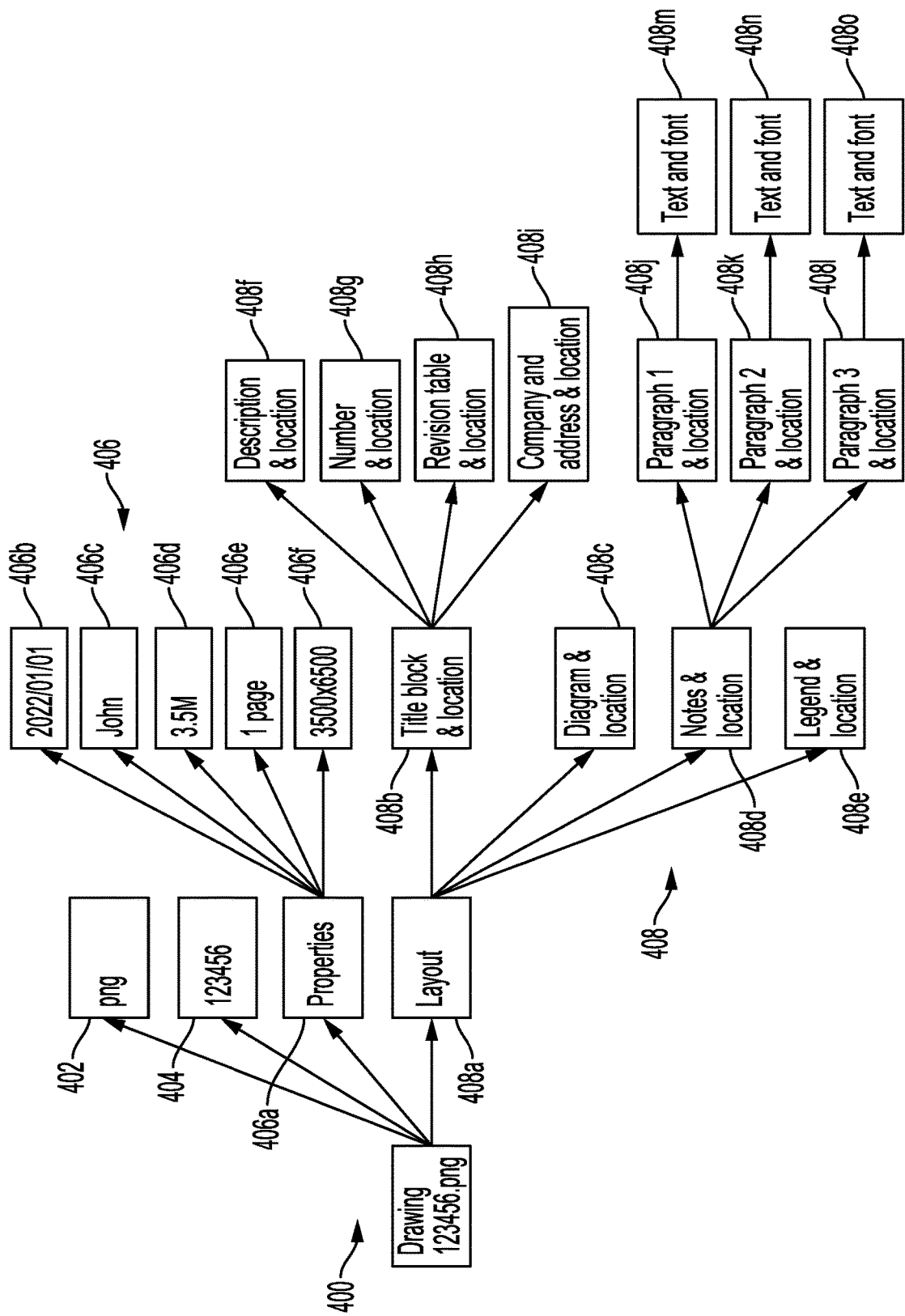
FIG. 4A depicts an example data structure according to the disclosed technology.

As an illustrative example, an example tree structure for a data file is illustrated in FIG. 4A. In this illustrative example, the data file may be a data file of a technical drawing, and tree structure 400 includes a file-type node 402, a file-name node 404, a plurality of file-property nodes 406, and a plurality of file-layout nodes 408. Further, in this illustrative example, the file-property nodes 406 include a parent file-property node 406a and child file-property nodes 406b-f. Still further, in this illustrative example, the file-layout nodes 408 include a parent file-layout node 408a and child file-layout nodes including a "Title block & location" node 408b, a "Diagram & location" node 408c, a "Notes & location" node 408d, and a "Legend & location node 408e. Further, the "Title block & location" node 408b includes child nodes of a "Description & location" node 408f, a "Number & location" node 408g, a "Revision table & location" node 408h, and a "Company address & location" node 408i. Yet still further, the "Notes & location" node 408d has child nodes including a "Paragraph 1 & location" node 408j (which in turn has a child "Text and font" node 408m), a "Paragraph 2 & location" node 408k (which in turn has a child "Text and font" node 408n), and a "Paragraph 3 & location" node 408l (which in turn has a child "Text and font" node 408o).

Figure 4B:
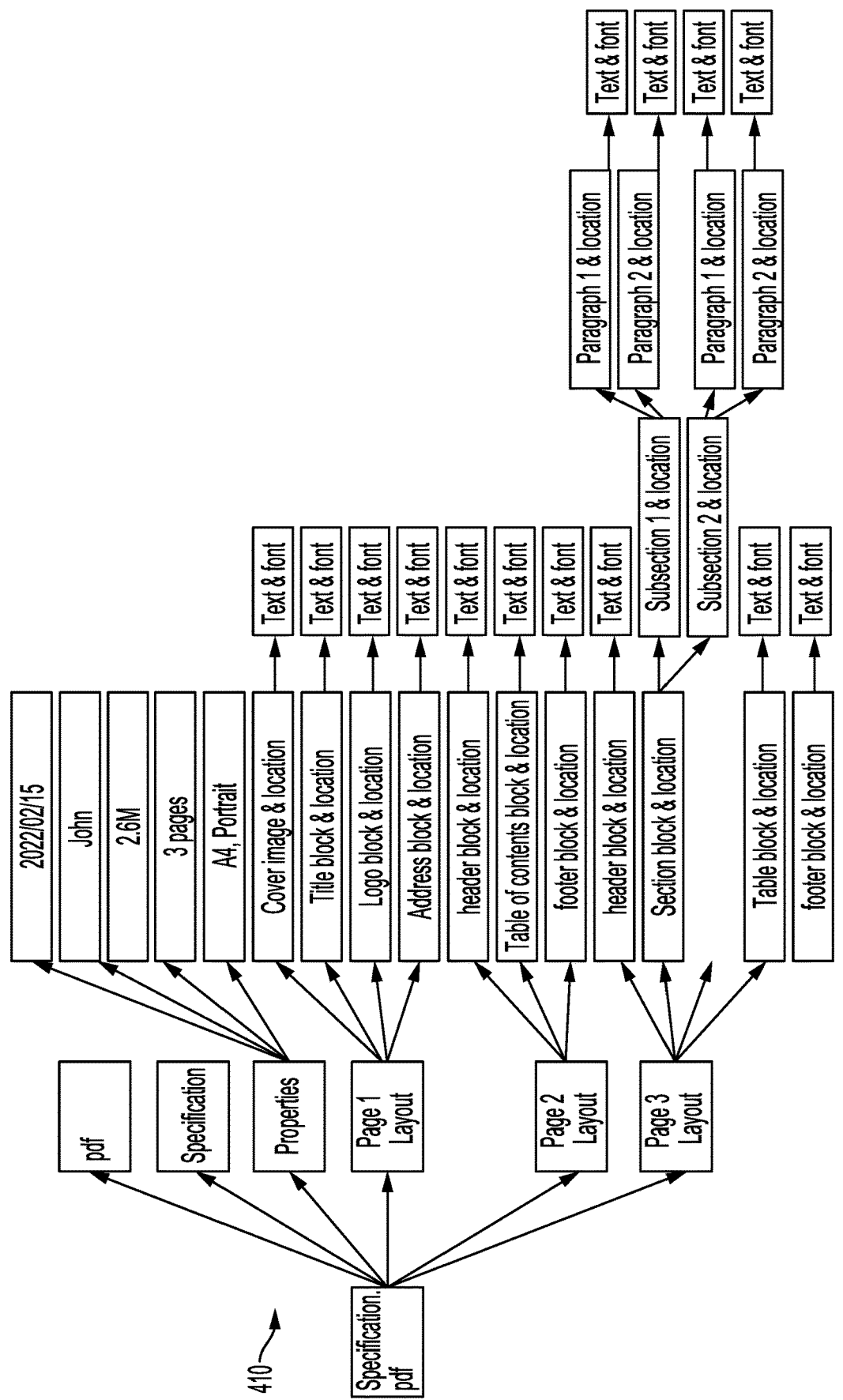
FIG. 4B depicts an example data structure according to the disclosed technology.

As another illustrative example, an example tree structure for another data file is illustrated in FIG. 4B. In this illustrative example, the data file may be a data file of a technical document such as a specification. Further, in this illustrative example, the data file is a specification document which has three pages. In addition to a file-type node, a file-name node, and file-property nodes, the tree structure 410 includes file-layout nodes that include respective parent file-layout nodes for each page of the specification and child file-layout nodes for the respective parent-file layout node. More specifically, the first page is a cover page and the child-layout nodes for the first page include nodes related to cover image, title block, logo block and address block.

Further, the second page is a table of contents and the child-layout nodes for the second page include nodes related to header block, table of contents block, and footer block. Still further, the third page is a page comprising text and a table and the child-layout nodes for the third page include nodes related to header bock, a section block divided into two subsections (each subsection with two paragraphs), a table block inserted under the section block, and a footer block. It should be understood that these tree structures are intended as illustrative examples only and other example tree structures are possible as well. Further, the generated tree structure may vary based on various factors, including, for instance, the contents of the data file itself and/or the organizational format for the tree structure, among other possibilities.

As another possibility, the data structure may be another type of data structure that encodes relationships between nodes, such as a graph-based data structure. Other similar data structures that describe the relationship between nodes like this are also possible.

Back-end computing platform 102 may carry out the function of determining the respective data structure in various ways, and in at least some implementations, the computing platform may utilize one or more data analytics operations that serve to obtain and/or analyze the contents associated with the respective data file and then determine a data structure for the respective data file. In this respect, the data analytics operations carried out by back-end computing platform 102 may be embodied in any of various forms, such as a data science model that is applied to data files and/or the obtained contents associated with the respective data file in order to derive a respective data structure for the respective data file. An example data science model is described in greater detail below. The data analytics operations carried out by the back-end computing platform 102 may be embodied in other forms as well.

c. Comparison of Data Structures and Identification of One or More Data Structure Differences Among Data Files Returning to FIG. 3, after determining the respective data structures for the respective data files, at block 306, back-end computing platform 102 compares the determined respective data structures and thereby identifies one or more data structure differences among the determined respective data structures for the data files. In general, the data structure differences among the determined respective data structures for the data files may include any difference between a data structure for a first data file and a data structure for a second data file, such as a difference between organization of the data structures and/or information contained within the data structures, among other possibilities. For example, in a scenario where the data structures are tree structures, a data structure difference may be a difference between an organization of the nodes of the tree structures and/or information of one or more nodes of the tree structures, among other possibilities.

Various differences between organization of the data structures are possible. For instance, in an example where the data structure is a tree structure such as the tree structure of FIG. 4A or the tree structure of FIG. 4B, there may be differences in a number of nodes of a first tree structure for a first data file compared to a number of nodes of a second tree structure for a second data file. More particularly, there may be a difference in a number of file-type nodes, file-name nodes, file-property nodes, and/or file-layout nodes (e.g., fewer and/or additional child nodes). Other example differences between organization of the data structures are possible as well.

Further, various differences between information contained within the data structures are possible. For instance, in an example where the data structure is a tree structure such as the tree structure of FIG. 4A or the tree structure of FIG. 4B, there may be a difference in information contained within one or more nodes. For example, there may be a difference between the text contained within a given node. As another example, there may be a difference between a location identified in a given node. As yet another example, there may be a difference between a font identified in a given node. Other example differences between information contained within the data structure are possible as well.

Other example data structure differences are possible as well.

Figure 5A:
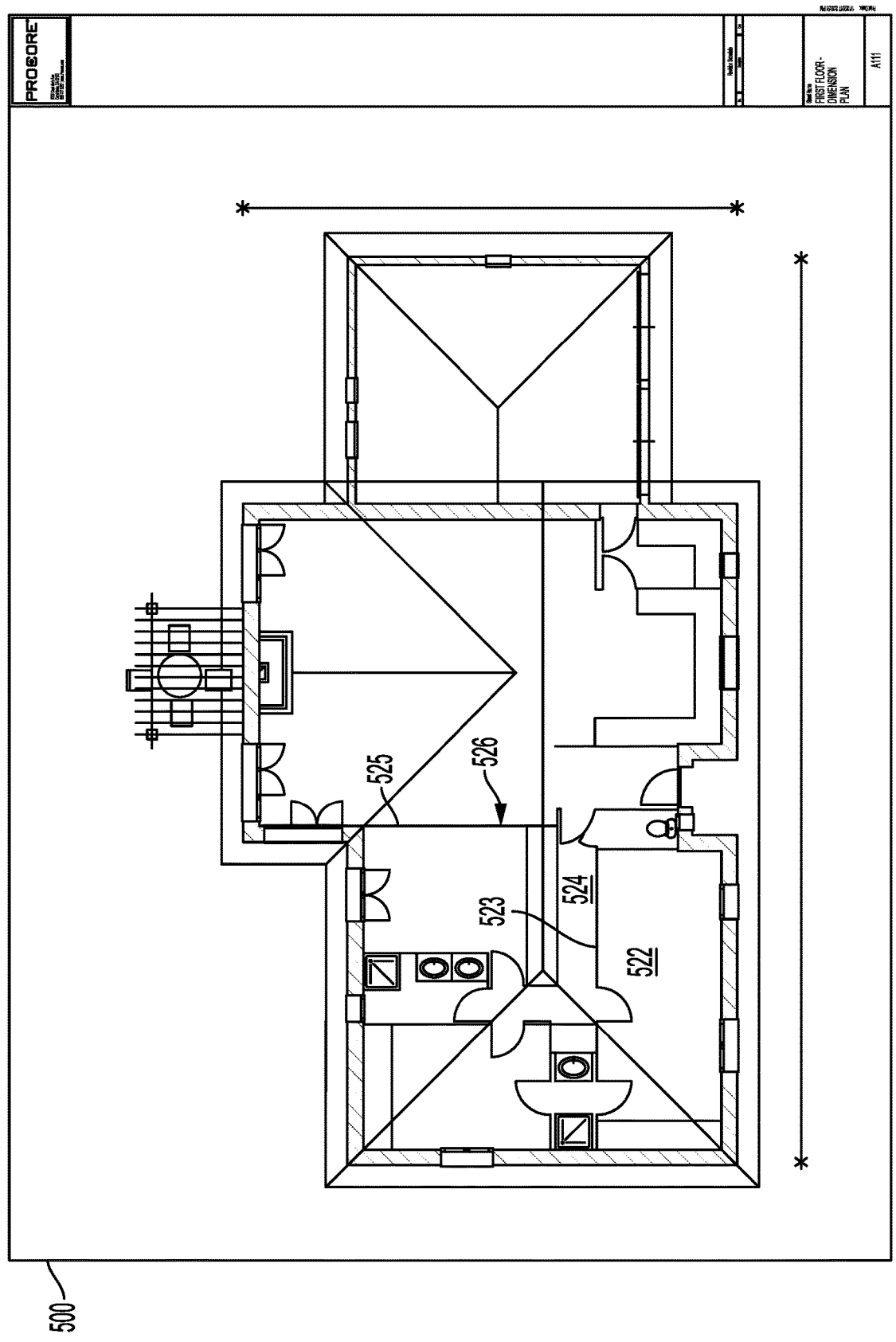
FIG. 5A depicts an example technical drawing of a first data file.
Figure 5B:
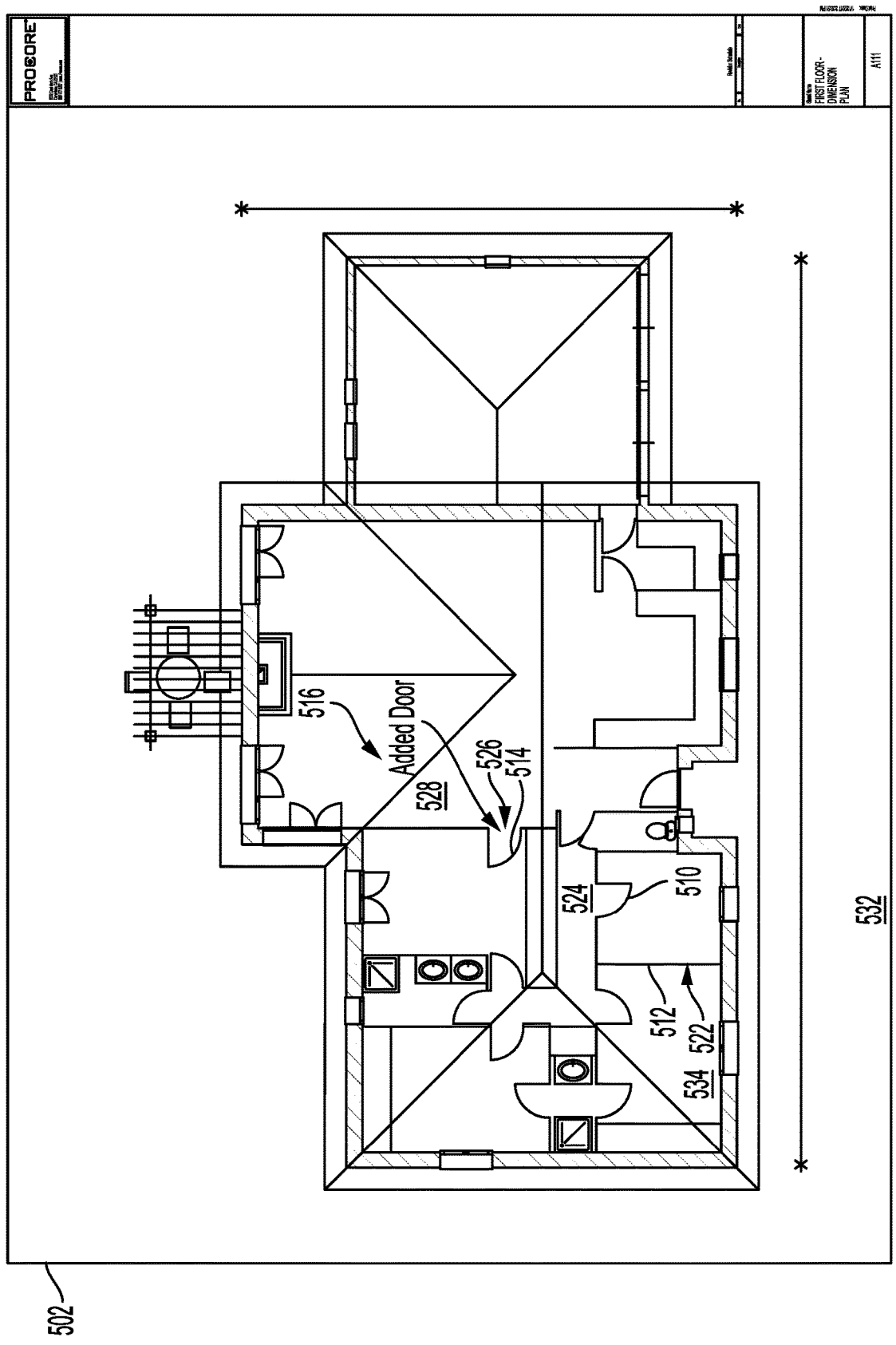
FIG. 5B depicts an example technical drawing of a second data file.
Figure 5C:
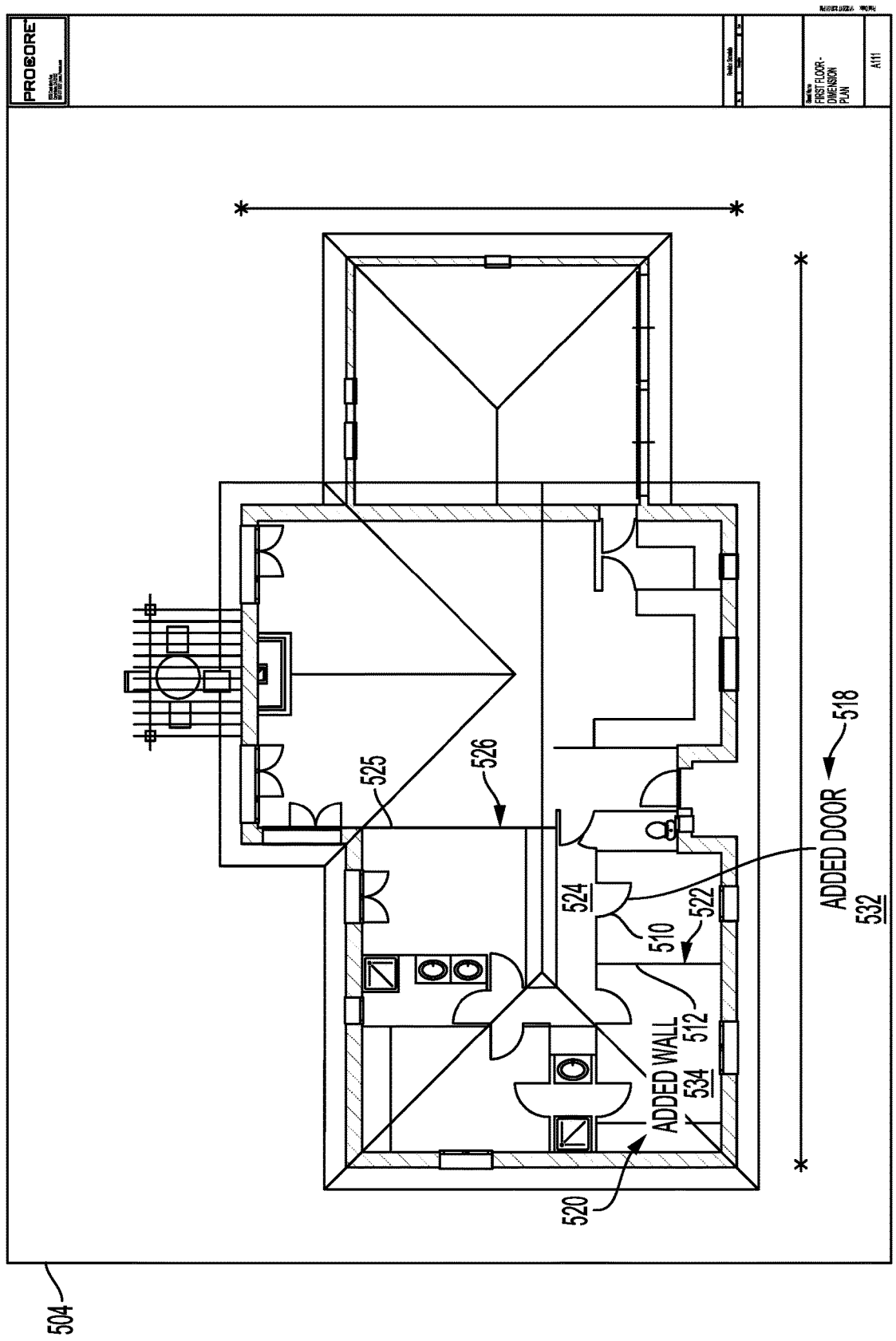
FIG. 5C depicts an example technical drawing of a third data file.

An illustrative example of comparing determined respective data structures and thereby identifying one or more data structure differences among the determined respective data structures for the data files is described with reference to FIGS. 5A-C and the example tree structure of FIG. 4A. In this illustrative example, a first data file may be a data file of technical drawing 500 (see FIG. 5A), a second data file may be a data file of technical drawing 502 (see FIG. 5B), and a third data file may be a data file of technical drawing 504 (see FIG. 5C). Further, the first, second, and third data files are different copies of a given same data file for a given construction-related matter (e.g., technical drawings 500, 502, and 504 are different versions of the same technical drawing). Still further, technical drawings 500, 502, and 504 have various properties and differences from one another. For instance, compared to technical drawing 500, technical drawing 502 has an additional door 510, an additional wall 512, an additional door 514, and an indication 516 of an added door. Further, compared to technical drawing 500, technical drawing 504 has additional door 510, additional wall 512, an indication 518 of an added door, and an indication 520 of an added wall. Still further, compared to technical drawing 504, technical drawing 502 (i) has additional door 514 and an indication 516 of an added door but (ii) does not have indication 518 of an added door or indication 520 of an added wall.

These three data files may be different versions that represent different revisions to the same technical drawing at various stages of the design and/or redesign of the construction project. As indicated above, employing a user-driven approach (such as the user-driven approach discussed above) so as to determine a revision history for the different versions and identify the most up-to-date copy of this same technical drawing (e.g., which version represents the most current design that is to be reviewed or constructed) may be a time-consuming and difficult process and prone to user error. On the other hand, the disclosed approach for determining a revision history for a plurality of data files (such as these three different versions of the same technical drawing) and identifying a most up-to-date copy may help to significantly reduce the time and effort associated with a user-driven approach as well as help to reduce or limit errors that may otherwise occur in the user-driven approach (e.g., errors due to user error).

As indicated above, back-end computing platform 102 may determine respective data structures for the data files for technical drawings 500, 502, and 504. The respective data structures determined for the first data file, second data file, and third data file can reflect these example properties and differences between the data files for technical drawings 500, 502, and 504. For example, in a situation where the determined data structures for the first, second, and third data files are tree structures such as tree structure 400 described above, the structure of the file-layout nodes may reflect these example differences. For instance, with reference to FIG. 5A, (i) a diagram and location node for technical drawing 500 may indicate a lack of a wall at location 522, (ii) a diagram and location node for technical drawing 500 may indicate a wall 523 at location 524, and (iii) a diagram and location node for technical drawing 500 may indicate a wall 525 at location 526. Further, with reference to FIG. 5B, (i) a diagram and location node for technical drawing 502 may indicate door 514 at location 526, (ii) a diagram and location node for technical drawing 502 may indicate wall 512 at location 522, (iii) a diagram and location node for technical drawing 502 may indicate door 510 at location 524, and (iv) a notes and location node for technical drawing 502 may indicate a note of "Added Door" at location 528. Still further, with reference to FIG. 5C, (i) a diagram and location node for technical drawing 504 may indicate door 510 at location 524, (ii) a diagram and location node for technical drawing 504 may indicate wall 512 at location 522, (iii) a diagram and location node for technical drawing 504 may indicate wall 525 at location 526, (iv) a note and location node for technical drawing 504 may indicate a note of "Added Door" at location 532, and (v) a notes and location node for technical drawing 504 may indicate a note of "Added Wall" at location 534.

Comparison of these determined respective data structures for the first, second, and third data files may in turn reveal various data structure differences among the determined respective data structures for the data files. For instance, comparing the data structure for the first data file of technical drawing 500 to the data structure for the second data file of technical drawing 502 may reveal the following data structure differences: compared to the data structure for the first data file of technical drawing 500, the data structure for the second data file of technical drawing 502 has (i) a diagram and location node for technical drawing 502 indicating door 514 at location 526 (rather than a diagram and location node for technical drawing 500 indicating wall 525 at location 526), (ii) a diagram and location node for technical drawing 502 indicating wall 512 at location 522 (rather than a diagram and location node for technical drawing 500 indicating a lack of a wall at location 522), (iii) a diagram and location node for technical drawing 502 indicating door 510 at location 524 (rather than a diagram and location node for technical drawing 500 indicating wall 523 at location 524), and (iv) a notes and location node indicating a note of "Added Door" at location 528 (rather than an absence of such a node for technical drawing 500).

Further, comparing the data structure for the first data file of technical drawing 500 to the data structure for the third data file of technical drawing 504 may reveal the following data structure differences: compared to the data structure for the first data file of technical drawing 500, the data structure for the third data file of technical drawing 504 has (i) a diagram and location node for technical drawing 504 indicating door 510 at location 524 (rather than a diagram and location node for technical drawing 500 indicating wall 523 at location 524), (ii) a diagram and location node for technical drawing 504 indicating wall 512 at location 522 (rather than a diagram and location node for technical drawing 500 indicating a lack of a wall at location 522), (iii) a notes and location node for technical drawing 504 indicating a note of "Added Door" at location 532 (rather than an absence of such a node for technical drawing 500), and (iv) a notes and location node for technical drawing 504 indicating a note of "Added Wall" at location 534 (rather than an absence of such a node for technical drawing 500).

Still further, comparing the data structure for the second data file of technical drawing 502 to the data structure for the third data file of technical drawing 504 may reveal the following data structure differences: compared to the data structure for the third data file of technical drawing 504, the data structure for the second data file of technical drawing 502 (*i*) has (a) a diagram and location node for technical drawing 502 indicating door 514 at location 526 (rather than a diagram and location node for technical drawing 504 indicating wall 525 at location 526) and (b) a notes and location node for technical drawing 502 indicating a note of "Added Door" at location 528 (rather than an absence of such a node for technical drawing 504), but (ii) does not have (a) a notes and location node indicating a note of "Added Door" at location 532 and (b) a notes and location node indicating a note of "Added Wall" at location 534.

Back-end computing platform 102 may carry out the function of comparing the determined respective data structures and thereby identifying one or more data structure differences among the determined respective data structures for the data files in various ways, and in at least some implementations, the computing platform may utilize one or more data analytics operations that serve to analyze the determined respective data structures and then identify one or more data structure differences among the determined respective data structures for the data files. Such a data analytics operation may take various forms, including, for instance, the form of a data science model or the form of a user-defined set of rules that is applied to the determined respective data structures in order to derive data structure differences, among other possibilities. An example data science model is described in greater detail below. The data analytics operations carried out by the back-end computing platform 102 may be embodied in other forms as well.

d. Determination of Revision History for Data Files

Returning to FIG. 3, at block 308, back-end computing platform 102 determines, based on the identified one or more data structure differences among the determined respective data structures for the data files, a revision history for the plurality of data files. By identifying data structure differences among the data files, back-end computing platform 102 may determine the relationship (if any) between each data file of the plurality of data files (e.g., whether different data files are duplicates and/or whether the data files represent different versions of the same data file).

In general, the revision history for the plurality of data files may serve to indicate a relationship between a plurality of data files (e.g., whether the data files are duplicates and/or revised copies of a given data file for a given construction-related matter and/or whether any of the analyzed data files are not related to one another) and how the files are related to one another (e.g., a version order of the data files).

In an example, in a scenario where the data structure is a tree structure such as the tree structure of FIG. 4A, two data files may be duplicates of one another if the file-property nodes 406 and file-layout nodes 408 (and the information contained in those nodes) for those two data files are identical. On the other hand, if the two data files represent different revisions of the same document, at least some portion of the file-property nodes 406 and file-layout nodes 408 (and the contents of those nodes) would be different. For instance, at least one node and/or information under at least one node would be different, or perhaps one version of the document may include more nodes (i.e., additional contents) that the other version does not. The revised or additional portion would correspond to the at least one different node and/or different information under at least one node.

As an illustrative example, and continuing the example discussed above with respect to FIGS. 5A-C where each of the data files is a different copy of a data file for a given construction-matter (e.g., a given technical drawing), back-end computing platform 102 may determine, based on the identified data structure differences among the determined respective data structures for the data files, that (i) the three data files are different copies of a data file for a given construction-related matter but are not duplicates of one another, (ii) the first data file for technical drawing 500 is a first version, (iii) the third data file for technical drawing 504 is the second version, and (iv) the second data file for technical drawing 502 is the third version (which, in this example, is the current or most up-to-date version).

In this illustrative example, given that the identified data structure differences among the three data files reveal that, compared to technical drawing 500, technical drawings 502 and 504 both include added material and notes regarding added material, back-end computing platform 102 may determine that the first data file for technical drawing 500 is the first version of the data file. Further, given that the identified data structure differences between the second data file for technical drawing 502 and the third data file for technical drawing 504 reveal that, compared to technical drawing 504, technical drawing 502 includes the added door and added wall of technical drawing 504 (without the notes regarding those additions), as well as an additional change made and a note that the additional change was added, back-end computing platform 102 may determine that technical drawing 504 is the second version and technical drawing 502 is the third version (which, in this example, is the current or most up-to-date version).

As mentioned above, in this illustrative example discussed above with respect to FIGS. 5A-C, the data files are not duplicates of one another. However, in another example, two data files may be considered duplicates of one another if (i) the file-name node 404 for those two data files are different from one another but (ii) the file-property nodes 406 and file-layout nodes 408 (and the information contained in those nodes) for those two data files are identical. In another example, in addition to having a different file name, different copies of a data file may also have one or more different file properties (e.g., different data and/or file size), but the different copies of the data file may otherwise be the same. Therefore, in such an example, in order to determine whether a first data file and a second data file are duplicates or different versions of the same data file, back-end computing platform 102 may be configured to compare the layouts of the data files to determine whether the files are duplicates or different copies. The two data files may be considered duplicates of one another if the file-layout nodes 408 (and the information contained in those nodes) for those two data files are identical. Other examples are possible as well.

Further, as mentioned above, in this illustrative example discussed above with respect to FIGS. 5A-C, each data file of the plurality of data files is a different copy of a given data file. However, in other examples, the plurality of obtained data files may comprise different sets of data files, where each set includes one or more copies of a different respective data file. In such an example, comparing the determined respective data structures and thereby identifying one or more data structure differences among the determined respective data structures for the data files may reveal different sets of data files among the plurality of data files, wherein each set comprises one or more copies of a different respective data file. For instance, the plurality of data files may include a first set of data files that comprises one or more copies of a first data file (e.g., a technical drawing for a given construction-related matter), a second set of data files that comprise one or more copies of a second data file (e.g., a text-based document for a given construction-related matter), a third set of data files that comprises one or more copies of a third data file (e.g., a spreadsheet for a given construction-related matter), and so forth. Further, in such an example, determining a revision history for the plurality of data files may involve determining the different sets of data files and/or version orders for the different sets of data files. For instance, determining a revision history for the plurality of data files may involve determining a first version order for the first set of data files among the plurality of data files, a second version order for the second set of data files among the plurality of data files, a third version order for the third set of data files among the plurality of data files, and so forth.

In an example, in order to determine different sets of data files, back-end computing platform 102 may be configured to determine whether respective data structures have a threshold level of similarity to one another. In turn, if given data structures have a threshold level of similarity to one another, then back-end computing platform 102 may treat the data files associated with those given data structures as part of a set (e.g., different copies of a given data file). Various threshold levels of similarity are possible. For instance, in an example, a threshold level of similarity may be a threshold percentage of nodes of a data structure being the same (e.g., 50% or more). As another example, a threshold level of similarity may be a threshold percentage of content within nodes (e.g., text) being the same. Other examples for the threshold level of similarity are possible as well. In addition, other example ways to determine different sets of data files are possible as well.

As mentioned above, because construction projects may be complex endeavors involving multiple different phases, large numbers of data files (which may be on the order of thousands, tens of thousands, hundreds of thousands, etc.) may be generated and used throughout a construction project, many of which may be different revisions of a same data file and/or duplicates of a same data file. The disclosed technology may help with control and management of a large number of data files. Back-end computing platform 102 may beneficially analyze a large number of data files (e.g., documents) to automatically determine a revision history for that large number of documents. Further, based on the determined revision history, the large number of data files may be controlled and managed as desired.

The function of determining, based on the identified one or more data structure differences among the determined respective data structures for the data files, a revision history for the plurality of data files may take various forms, and in at least some implementations, back-end computing platform 102 may utilize one or more data analytics operations that each serve to analyze the identified one or more data structure differences among the determined respective data structures for the data files and then determine a revision history based on that analysis. Such a data analytics operation may take various forms, including, for instance, the form of a data science model that is applied to the data structure differences, among other possibilities. An example data science model is described in greater detail below. The data analytics operations carried out by the back-end computing platform 102 may be embodied in other forms as well.

e. Transmission of Communication Related to the Revision History

Returning to FIG. 3, at block 310, back-end computing platform 102, transmits, to a client station, a communication related to the revision history for the plurality of data files and thereby causes an indication of the revision history to be presented at a user interface of the client station. In general, the indication presented at the user interface of the client station may include information suitable to serve to indicate the revision history, and the indication may take various forms, one example of which is shown in FIG. 6. In particular, FIG. 6 depicts an example snapshot 600 of a GUI 602 that displays an indication 604 of the revision history for the data files for technical drawings 500, 502, and 504. In this example, the indication 604 comprises a textual indicator 604a reflecting that "Data File for Technical Drawing 500" is version 1, a textual indicator 604b reflecting that "Data File for Technical Drawing 504" is version 2, and a textual indicator 604c reflecting that "Data File for Technical Drawing 502" is version 3.

The indication of the revision history may take other forms as well. For instance, in an example, back-end computing platform 102 may generate and send an email to an entity associated with the data files (e.g., a representative of a subcontractor responsible for a task associated with the data files) and the indication may be presented at the user interface of the client station when the email is viewed by a user of the client station. As other possibilities, back-end computing platform 102 may initiate the sending of another type of communication, such as an autogenerated text message or phone call. As another possibility, back-end computing platform 102 may generate new file names for each of the data files, where the generated file names provide an indication of the version order, and then save the data files with the new generated file names so that they are accessible within the SaaS application for future access. Other examples are possible as well.

Further, in general, the client station to which the communication is sent may be a client station associated with any suitable entity. For instance, in an example, the client station may be associated with a document controller for a given construction project. In another example, the client station may be associated with an entity responsible for a task associated with the data file (e.g., a subcontractor). Other examples are possible as well.

ii. Example Data Science Model(s)

As discussed above, back-end computing platform 102 may be configured to utilize one or more data analytics operations that serve to (i) for each respective data file of the plurality of obtained data files, obtain contents associated with the respective data file and evaluate the contents associated with the respective data file to determine a respective data structure for the respective data file, (ii) compare the determined respective data structures and thereby identify one or more data structure differences among the determined respective data structures for the data files, and (iii) based on the identified one or more data structure differences among the determined respective data structures for the data files, determine a revision history for the plurality of data files. Further, as mentioned above, such one or more data analytics operations may take various forms, including, for instance, the form of one or more data science models among other possibilities.

In practice, such a data science model may comprise a machine learning model that has been created by applying one or more machine learning techniques (e.g., supervised and/or unsupervised machine learning techniques) to a set of training data, examples of which may include regression, random forest, support vector machines (SVM), artificial neural networks, Naïve Bayes, decision trees, dimensionality reduction, k-nearest neighbor (kNN), gradient boosting, clustering, and association, but data science models for performing data analytics operations could take other forms and be created in other manners as well.

In some examples, back-end computing platform 102 may use separate machine learning models for the various functions of (i) for each respective data file of the plurality of obtained data files, obtaining contents associated with the respective data file and evaluating the contents associated with the respective data file to determine a respective data structure for the respective data file, (ii) comparing the determined respective data structures and thereby identifying one or more data structure differences among the determined respective data structures for the data files, and (iii) based on the identified one or more data structure differences among the determined respective data structures for the data files, determining a revision history for the plurality of data files. For instance, back-end computing platform 102 may (i) use a first machine learning model for the function of, for each respective data file of the plurality of obtained data files, obtaining contents associated with the respective data file and evaluating the contents associated with the respective data file to determine a respective data structure for the respective data file, (ii) use a second machine learning model for the function of comparing the determined respective data structures and thereby identifying one or more data structure differences among the determined respective data structures for the data files, and (iii) use a third machine learning model for the function of, based on the identified one or more data structure differences among the determined respective data structures for the data files, determining a revision history for the plurality of data files.

In other examples, back-end computing platform 102 may use a single machine learning model for the various functions of (i) for each respective data file of the plurality of obtained data files, obtaining contents associated with the respective data file and evaluating the contents associated with the respective data file to determine a respective data structure for the respective data file, (ii) comparing the determined respective data structures and thereby identifying one or more data structure differences among the determined respective data structures for the data files, and (iii) based on the identified one or more data structure differences among the determined respective data structures for the data files, determining a revision history for the plurality of data files.

In yet other examples, back-end computing platform 102 may use a single machine learning model for two or more of these functions. For instance, back-end computing platform 102 may use a single machine learning model for the functions of (i) comparing the determined respective data structures and thereby identifying one or more data structure differences among the determined respective data structures for the data files and (ii) based on the identified one or more data structure differences among the determined respective data structures for the data files, determining a revision history for the plurality of data files. Other examples are possible as well.

As indicated above, the one or more machine learning models may be created using any of various supervised and/or unsupervised learning techniques. In an example, back-end computing platform 102 may use a machine learning model created based on an unsupervised machine learning technique to, for each respective data file, evaluate the contents associated with the respective data file to determine a respective data structure for the respective data file. Back-end computing platform 102 may then use one or more machine learning models created based on a supervised machine learning technique to (i) compare the determined respective data structures and thereby identify one or more data structure differences among the determined respective data structures for the data files and (ii) based on the identified one or more data structure differences among the determined respective data structures for the data files, determine a revision history for the plurality of data files.

iii. Flagging Revision(s) and Underlying Reason(s) for Revision(s)

In addition to being configured to determine a revision history for the plurality of data files and cause an indication of the revision history to be presented at a user interface of the client station, back-end computing platform 102 may also be configured to cause flags of revisions, or a similar notification, to be presented at a user interface of a client station. For instance, in an example, the identified one or more data structure differences among the determined respective data structures for the data files may include one or more data structure differences between a first data file and a second data file that each correspond to a respective revision between the first data file and the second data file. In such an example, back-end computing platform 102 may be configured to identify the respective revision(s) between the first data file and the second data file and to transmit, to a client station, data that flags each respective revision between the first data file and the second data file and thereby cause, for each respective revision, a flag of the respective revision to be presented at a user interface of the client station.

Figure 7:
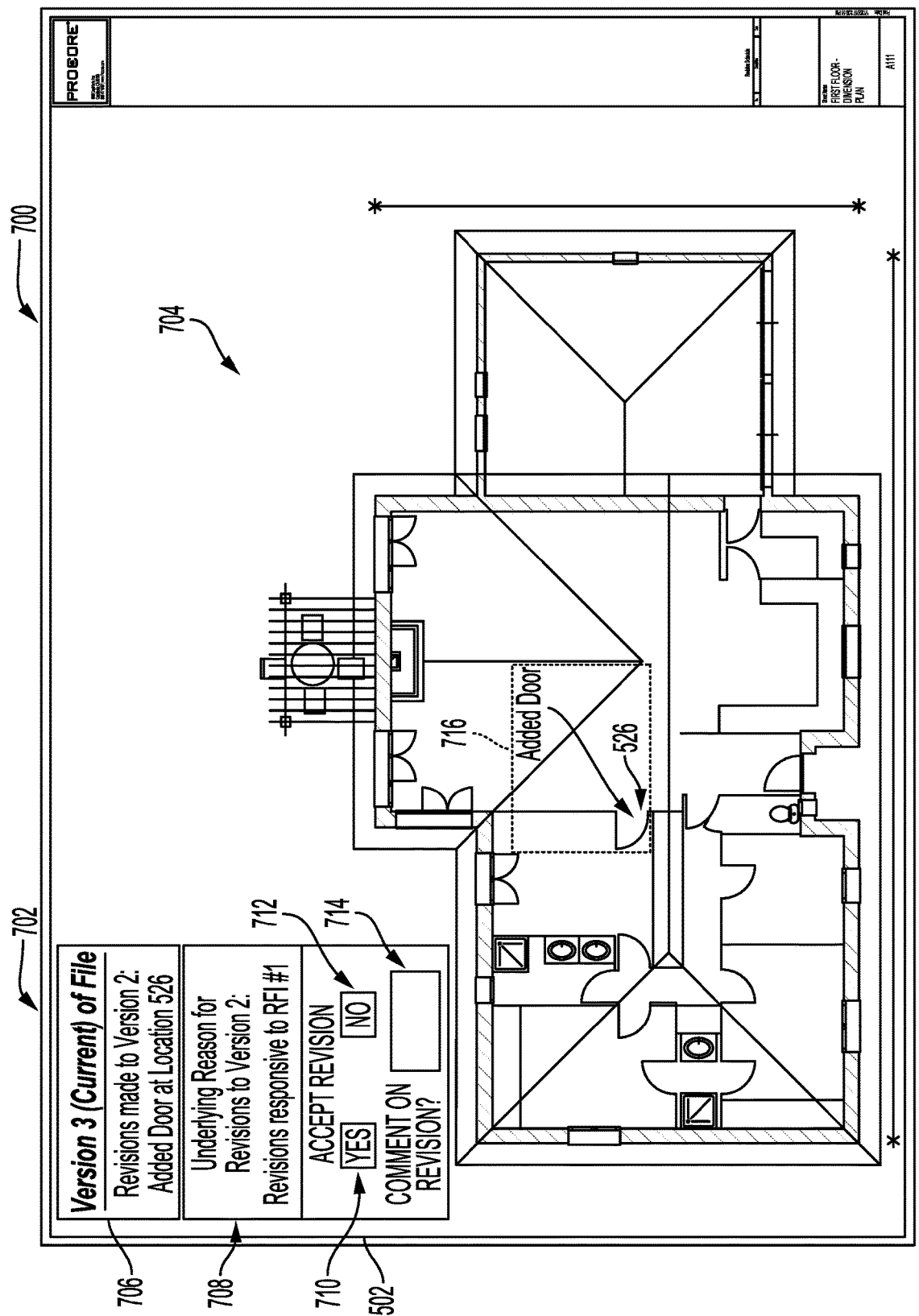
FIG. 7 depicts an example snapshot of a GUI that may be presented to a user according to the disclosed technology.

In general, the flag of the revision presented at the user interface of the client station may include information suitable to serve to indicate the revision, and the flag may take various forms, one example of which is shown in FIG. 7. In particular, FIG. 7 depicts an example snapshot 700 of a GUI 702 that displays a view 704 of technical drawing 502 and a flag 706 of a revision made to the prior version (which, in this example, was the data file for technical drawing 504 (see FIG. 5C). In this example, the flag 706 includes a textual indicator of the revision and location of the revision. The flag 706 of the revision may take other forms as well including, for instance, highlighting of the revision, shading of the revision, a flagging graphic adjacent to the revision, and/or other similar visual indicators, among other possibilities. For instance, with reference to FIG. 7, the flag may be highlighting of the area 716 associated with the revision.

In some examples, the client station at which the revision history is presented and the client station at which the flag is presented are the same client station. On the other hand, in other examples, the client station at which the revision history is presented and the client station at which the flag is presented are different client stations. As one possibility, the client station at which the revision history is presented and the client station at which the flag is presented may be different client stations associated with the same user. For instance, the client station at which the revision history is presented may be a computer of the user, and the client station at which the flag is presented may be a phone of the user. As another possibility, the client station at which the revision history is presented may be a client station of a first user, and the client station at which the flag is presented may be a client station of a different, second user. For instance, the client station at which the revision history is presented may be a client station used by a document controller for a given-construction related project, and the client station at which the flag is presented may be a client station associated with a user responsible for updating the technical drawing. Other examples are possible as well.

In addition to flagging revisions, back-end computing platform 102 may also be configured to identify underlying reasons for revisions and cause indications of the identified underlying reasons to be presented at a user interface of a client station. For instance, back-end computing platform 102 may be configured to, for a given data file of the plurality of data files, identify one or more data structure differences between the given data file and a previous version of the given data file. Back-end computing platform 102 may further be configured to, for each data structure difference of at least one of the one or more data structure differences between the given data file and the previous version of the given data file, (i) identify an underlying reason that led to the data structure difference and (ii) transmit, to a client station, a communication related to the identified underlying reason and thereby cause an indication of the identified underlying reason to be presented at a user interface of the client station. In general, various underlying reasons for revisions are possible, examples of which include, for instance, response to a data object associated with a construction project or a response to a comment or question embedded in a data file, among other possibilities.

In general, the indication of the identified underlying reason at the user interface of the client station may include information suitable to serve to indicate the identified underlying reason, and the flag may take various forms, one example of which is shown in FIG. 7. In particular, GUI 702 displays an indication 708 of the underlying reasons for the revision that is flagged by flag 706. In this example, the indication 708 is a textual indicator that indicates the revision is responsive to RFI #1. The indication 708 may take other forms as well.

Back-end computing platform 102 may determine the underlying reason that led to a data structure difference in various ways. As one possibility, back-end computing platform 102 may identify one or more data objects with similar attributes to the revision and then, for each identified data object, determine whether the revision is in response to that data object. In practice, a SaaS application for construction management may allow various different types of data objects related to the particular construction project to be created, stored, and accessed by users of the SaaS application. Numerous types of data objects related to the particular construction project are possible, examples of which include "request for information" ("RFI") data objects (e.g., data objects for the construction project related to requested information about given project tasks), "submittal" data objects (e.g., data objects for the construction project related to information provided by a responsible contractor (such as contractors and sub-contractors) to a general contractor), "incident" data objects (e.g., data objects for the construction project related to incidents (such as quality and/or safety incidents) that occurred during the construction project), "punch list" data objects (e.g., data objects that memorialize punch items on the construction project), "schedule" data objects (e.g., data objects that memorialize a schedule(s) related to the construction project), "inspection" data objects (e.g., data objects that memorialize an inspection(s) related to the construction project), "observation" data objects (e.g., data objects for the construction project that memorialize observations made during on-site inspections of the construction project), various types of financial-related data objects such as "budget" data objects (e.g., data objects that memorialize a budget item(s) related to the construction project), and/or "field productivity" data objects (e.g., data objects that memorialize items related to field productivity for the construction project, such items regarding time sheets and/or crews for the construction project). Other types of data objects are possible as well.

Back-end computing platform 102 may be configured to (i) obtain data objects associated with the construction project that are associated with the given data file and thereafter analyze those data objects to determine whether a revision in the data file is related to the data object. For instance, a revision to a data file of removing a wall at a given location may be related to an "RFI" data object that dealt with whether a wall is needed at that given location. Based on analysis of the data object and the revision, back-end computing platform 102 may determine that an underlying reason for the revision is that the revision is responsive to the requested information about the given project task. As one possibility, the given data file may include, among its contents, an indication of a location within the construction project (e.g., based on a project-specific coordinate system) that corresponds to the revision to the wall that is depicted in the data file. Further, the RFI data object may include information that similarly associates it with the same location within the construction project. Accordingly, computing platform 102 may determine that the reason for the revision is likely to be the RFI data object. Other examples are also possible.

As another possibility, back-end computing platform 102 may analyze the contents of the data file to determine whether the contents indicate a reason for the revision. For instance, an example data file may include a note that links the data file to a given data object (e.g., a given RFI), and analysis of the revision in the data file and the linked data object (e.g., the given RFI) may reveal that the revision was made in response to the linked data object (e.g., the given RFI). Other examples of determining the underlying reason that led to a data structure difference are possible as well.

Similar to the example above with respect to the client station at which the flag of the revision is presented, in some examples, the client station at which the revision history is presented and the client station at which the indication of the identified underlying reason is presented are the same client station. On the other hand, in other examples, the client station at which the revision history is presented and the client station at which indication of the identified underlying reason is presented are different client stations.

In some examples, the indication of the underlying reason to be presented at the user interface of the second client station further comprises a selectable indicator for accepting the data structure difference, a selectable indicator for rejecting the data structure difference, and/or a selectable indicator for providing a comment to the data structure difference. For example, example selector indicators for accepting the data structure difference, rejecting the data structure difference, and providing a comment to the data structure difference are illustrated in FIG. 7. In particular, GUI 702 displays a selectable indicator 710 for accepting the revision, a selectable indicator 712 for rejecting the revision, and a selectable indicator 714 for providing a comment to the revision. Other example indicators for accepting the data structure difference, rejecting the data structure difference, and/or providing a comment to the data structure difference are possible as well. In an example, in response to a user accepting the revision, back-end computing platform 102 may implement the change and save the revised version. Similarly, in response to a user rejecting the revision, back-end computing platform 102 may implement the change and save the revised version.

iv. Living Documents

In the examples above, back-end computing platform 102 performs the described functionality with respect to a plurality of different data files. In other examples, back-end computing platform 102 may perform the described functionality with respect to a living document such as a web-browser based document. In practice, a living document may be a single file that contains a plurality of different versions and, in some cases, such previous saved versions can be accessed (e.g., so as to revert the document back to a prior version and/or view revisions made by one or more individuals).

In an example, back-end computing platform 102 may obtain the various versions associated with a living document, and analyze those various versions so as to perform the described functionality with respect to a living document. The functionality with respect to a living document is similar in many respects to the functionality with respect to a plurality of data files, and thus is not described in as great of detail. It should be understood, however, that any of the possibilities and permutations described with respect to a plurality of data files are also possible with respect to a plurality of versions of the living document.

For instance, in an example, back-end computing platform 102 may (i) for each respective version of the living document, obtain contents associated with the respective version and evaluate the contents associated with the respective version to determine a respective data structure for the respective version (ii) compare the determined respective data structures and thereby identify one or more data structure differences among the determined respective data structures for the versions, and (iii) based on the identified one or more data structure differences among the determined respective data structures for the versions, determine a revision history for the plurality of versions.

Further, in an example, the identified one or more data structure differences among the determined respective data structures for the versions may include one or more data structure differences between a first version and a second version that each correspond to a respective revision between the first version and the second version. Back-end computing platform 102 may be configured to transmit, to a client station, data that flags each respective revision between the first version and the second version and thereby cause, for each respective revision, a flag of the respective revision to be presented at a user interface of the client station.

Still further, in an example, back-end computing platform 102 may be configured to, for a given version of the plurality versions, identify one or more data structure differences between the given version and a previous version. Back-end computing platform 102 may further be configured to, for each data structure difference of at least one of the one or more data structure differences between the given version and a previous version, (i) identify an underlying reason that led to the data structure difference and (ii) transmit, to a client station, a communication related to the identified underlying reason and thereby cause an indication of the identified underlying reason to be presented at a user interface of the second client station. In an example, the indication of the underlying reason to be presented at the user interface of the client station comprises a selectable indicator for accepting the data structure difference, a selectable indicator for rejecting the data structure difference, and/or a

IV. Conclusion

Example embodiments of the disclosed innovations have been described above. Those skilled in the art will understand, however, that changes and modifications may be made to the embodiments described without departing from the true scope and spirit of the present invention, which will be defined by the claims.

For instance, those in the art will understand that the disclosed operations for determination of a revision history for a plurality of data files may not be limited to only construction projects. Rather, the disclosed operations could be used in other contexts in connection with other types of projects as well.

Further, to the extent that examples described herein involve operations performed or initiated by actors, such as "humans," "operators," "users," or other entities, this is for purposes of example and explanation only. The claims should not be construed as requiring action by such actors unless explicitly recited in the claim language.

The invention claimed is:

1. A computing platform comprising:
a network interface;
at least one processor;
at least one non-transitory computer-readable medium; and
program instructions stored on the at least one non-transitory computer-readable medium that are executable by the at least one processor such that the computing platform is configured to:
obtain a plurality of data files associated with a construction project involving construction of one or more buildings;
for each respective data file of the plurality of obtained data files, obtain contents associated with the respective data file and evaluate the contents associated with the respective data file to determine a respective data structure for the respective data file;
compare the determined respective data structures and thereby identify one or more data structure differences among the determined respective data structures for the data files;
based on the identified one or more data structure differences among the determined respective data structures for the data files, determine a revision history for the plurality of data files;
transmit, to a first client station, a communication related to the revision history for the plurality of data files and thereby cause an indication of the revision history to be presented at a user interface of the first client station;
for a given data file of the plurality of data files, (i) identify one or more data structure differences between the given data file and a previous version of the given data file and (ii) identify one or more construction-project data objects associated with the given data file and the construction project involving construction of the one or more buildings, wherein each of the one or more construction-project data objects is a respective data object of a software as a service (SaaS) application for construction management; and
for each data structure difference of at least one of the one or more data structure differences between the given data file and the previous version of the given data file, (i) identify, based at least on the identified one or more construction-project data objects, an underlying reason that led to the data structure difference and (ii) transmit, to a second client station, a communication related to the identified underlying reason and thereby cause an indication of the identified underlying reason to be presented at a user interface of the second client station.

2. The computing platform of claim 1, wherein the plurality of obtained data files comprises three or more data files.

3. The computing platform of claim 2, wherein each of the three or more data files is a different copy of a file for a given construction-related matter of the construction project involving construction of the one or more buildings, and wherein the program instructions that are executable by the at least one processor such that the computing platform is configured to determine the revision history for the three or more data files comprise program instructions that are executable by the at least one processor such that the computing platform is configured to determine (i) a version order for the different copies and (ii) whether any of the different copies are duplicates of one another.

4. The computing platform of claim 1, wherein the program instructions that are executable by the at least one processor such that the computing platform is configured to determine the respective data structure for the respective data file comprises program instructions that are executable by the at least one processor such that the computing platform is configured to generate a tree structure for the respective data file that comprises a plurality of nodes, wherein each node is populated with a respective portion of the obtained contents associated with the respective data file, and wherein the plurality of nodes comprise at least one file-type node, at least one file-name node, a plurality of file-property nodes, and a plurality of file-layout nodes.

5. The computing platform of claim 4, wherein the program instructions that are executable by the at least one processor such that the computing platform is configured to compare the determined respective data structures and thereby identify one or more data structure differences among the determined respective data structures for the data files comprise program instructions that are executable by the at least one processor such that the computing platform is configured to:
compare a first tree structure for a first data file to a second tree structure for a second data file; and
identify one or more data structure differences between one or more file-layout nodes of the first tree structure and one or more file-layout nodes of the second tree structure.

6. The computing platform of claim 1, wherein the identified one or more data structure differences among the determined respective data structures for the data files comprise one or more data structure differences between a first data file and a second data file that each correspond to a respective revision between the first data file and the second data file, the computing platform further comprising program instructions stored on the non-transitory computer-readable medium that are executable by the at least one processor such that the computing platform is configured to:
transmit, to the second client station, data that flags each respective revision between the first data file and the second data file and thereby cause, for each respective revision, a flag of the respective revision to be presented at the user interface of the second client station.

7. The computing platform of claim 6, wherein the second client station is the same as the first client station.

8. The computing platform of claim 1, wherein the indication of the underlying reason to be presented at the user interface of the second client station comprises at least one of a selectable indicator for accepting the data structure difference, a selectable indicator for rejecting the data structure difference, or a selectable indicator for providing a comment to the data structure difference.

9. The computing platform of claim 1, wherein the second client station is the same as the first client station.

10. The computing platform of claim 1, wherein the contents associated with the respective data file comprise (i) metadata associated with the respective data file, (ii) layout information, (iii) text, (iv) text information associated with the text, and (v) location information.

11. The computing platform of claim 1, wherein the program instructions that are executable by the at least one processor such that the computing platform is configured to (i) for each respective data file of the plurality of obtained data files, obtain contents associated with the respective data file and evaluate the contents associated with the respective data file to determine the respective data structure for the respective data file, (ii) compare the determined respective data structures and thereby identify the one or more data structure differences among the determined respective data structures for the data files, and (iii) based on the identified one or more data structure differences among the determined respective data structures for the data files, determine the revision history for the plurality of data files comprise program instructions that are executable by the at least one processor such that the computing platform is configured to:
use one or more machine learning models to (i) for each respective data file of the plurality of obtained data files, obtain the contents associated with the respective data file and evaluate the contents associated with the respective data file to determine the respective data structure for the respective data file, (ii) compare the determined respective data structures and thereby identify the one or more data structure differences among the determined respective data structures for the data files, and (iii) based on the identified one or more data structure differences among the determined respective data structures for the data files, determine the revision history for the plurality of data files.

12. The computing platform of claim 1, wherein the program instructions that are executable by the at least one processor such that the computing platform is configured to, based on the identified one or more data structure differences among the determined respective data structures for the data files, determine the revision history for the plurality of data files comprise program instructions that are executable by the at least one processor such that the computing platform is configured to:
based on the identified one or more data structure differences among the determined respective data structures for the data files, (i) identify at least a first set of data files among the plurality of data files and a second set of data files among the plurality of data files and (ii) determine a first revision history for the first set of data files and a second revision history for a second set of data files.

13. A non-transitory computer-readable medium, wherein the non-transitory computer-readable medium is provisioned with program instructions that, when executed by at least one processor, cause a computing platform to:

obtain a plurality of data files associated with a construction project involving construction of one or more buildings;
for each respective data file of the plurality of obtained data files, obtain contents associated with the respective data file and evaluate the contents associated with the respective data file to determine a respective data structure for the respective data file;
compare the determined respective data structures and thereby identify one or more data structure differences among the determined respective data structures for the data files;
based on the identified one or more data structure differences among the determined respective data structures for the data files, determine a revision history for the plurality of data files;
transmit, to a first client station, a communication related to the revision history for the plurality of data files and thereby cause an indication of the revision history to be presented at a user interface of the first client station;
for a given data file of the plurality of data files, (i) identify one or more data structure differences between the given data file and a previous version of the given data file and (ii) identify one or more construction-project data objects associated with the given data file and the construction project involving construction of the one or more buildings, wherein each of the one or more construction-project data objects is a respective data object of a software as a service (SaaS) application for construction management; and
for each data structure difference of at least one of the one or more data structure differences between the given data file and the previous version of the given data file, (i) identify, based at least on the identified one or more construction-project data objects, an underlying reason that led to the data structure difference and (ii) transmit, to a second client station, a communication related to the identified underlying reason and thereby cause an indication of the identified underlying reason to be presented at a user interface of the second client station.

14. The non-transitory computer-readable medium of claim 13, wherein the plurality of obtained data files comprises three or more data files, and wherein each of the three or more data files is a different copy of a file for a given construction-related matter of the construction project involving construction of the one or more buildings, and wherein the program instructions that, when executed by at least one processor, cause the computing platform to determine the revision history for the three or more data files comprises program instructions that, when executed by at least one processor, cause the computing platform to determine (i) a version order for the different copies and (ii) whether any of the different copies are duplicates of one another.

15. The non-transitory computer-readable medium of claim 13, wherein the identified one or more data structure differences among the determined respective data structures for the data files comprise one or more data structure differences between a first data file and a second data file that each correspond to a respective revision between the first data file and the second data file, and wherein the non-transitory computer-readable medium is also provisioned with program instructions that, when executed by at least one processor, cause the computing platform to:
transmit, to the second client station, data that flags each respective revision between the first data file and the second data file and thereby cause, for each respective revision, a flag of the respective revision to be presented at the user interface of the second client station.

16. The non-transitory computer-readable medium of claim 13, wherein the program instructions that, when executed by at least one processor, cause the computing platform to, based on the identified one or more data structure differences among the determined respective data structures for the data files, determine the revision history for the plurality of data files comprise program instructions that, when executed by the at least one processor, cause the computing platform to:
- based on the identified one or more data structure differences among the determined respective data structures for the data files, (i) identify at least a first set of data files among the plurality of data files and a second set of data files among the plurality of data files and (ii) determine a first revision history for the first set of data files and a second revision history for a second set of data files.

17. A method carried out by a computing platform, the method comprising:
- obtaining a plurality of data files associated with a construction project involving construction of one or more buildings;
- for each respective data file of the plurality of obtained data files, obtaining contents associated with the respective data file and evaluating the contents associated with the respective data file to determine a respective data structure for the respective data file;
- comparing the determined respective data structures and thereby identifying one or more data structure differences among the determined respective data structures for the data files;
- based on the identified one or more data structure differences among the determined respective data structures for the data files, determining a revision history for the plurality of data files;
- transmitting, to a first client station, a communication related to the revision history for the plurality of data files and thereby causing an indication of the revision history to be presented at a user interface of the first client station;
- for a given data file of the plurality of data files, (i) identifying one or more data structure differences between the given data file and a previous version of the given data file and (ii) identifying one or more construction-project data objects associated with the given data file and the construction project involving construction of the one or more buildings, wherein each of the one or more construction-project data objects is a respective data object of a software as a service (SaaS) application for construction management; and
- for each data structure difference of at least one of the one or more data structure differences between the given data file and the previous version of the given data file, (i) identifying, based at least on the identified one or more construction-project data objects, an underlying reason that led to the data structure difference and (ii) transmitting, to a second client station, a communication related to the identified underlying reason and thereby causing an indication of the identified underlying reason to be presented at a user interface of the second client station.

18. The method of claim 17, wherein the plurality of obtained data files comprises three or more data files, wherein each of the three or more data files is a different copy of a file for a given construction-related matter, and wherein determining the revision history for the three or more data files comprises determining (i) a version order for the different copies and (ii) whether any of the different copies are duplicates of one another.

19. The computing platform of claim 1, wherein the one or more construction-project data objects comprise one or more data objects selected from the group consisting of: a request for information (RFI) data object, a submittal data object, an incident data object, a punch list data object, a schedule data object, an inspection data object, an observation data object, a budget data object, and a field productivity data object.

20. The computing platform of claim 1, wherein the one or more construction-project data objects is a request for information (RFI) data object, and wherein the underlying reason is that the revision is responsive to the RFI data object.

* * * * *